United States Patent [19]

Naujeck et al.

[11] Patent Number: 5,289,999
[45] Date of Patent: Mar. 1, 1994

[54] APPARATUS FOR MOUNTING SOLAR CELLS

[75] Inventors: Andreas Naujeck, Neuenkirchen-Seelscheid; Stephan Schneider, Spay, both of Fed. Rep. of Germany

[73] Assignee: Schottel Werft Joseph Becker GmbH & Co. KG, Spay, Fed. Rep. of Germany

[21] Appl. No.: 15,258

[22] Filed: Feb. 8, 1993

Related U.S. Application Data

[63] Continuation of Ser. No. 724,978, Jun. 28, 1991, abandoned.

[30] Foreign Application Priority Data

Jul. 4, 1990 [DE] Fed. Rep. of Germany ....... 4021339

[51] Int. Cl.⁵ ............................................. B64G 1/44
[52] U.S. Cl. ................................... 244/173; 136/251; 440/6
[58] Field of Search .............. 244/173; 136/206, 243, 136/244, 245, 251; 440/6

[56] References Cited

U.S. PATENT DOCUMENTS

| | | | |
|---|---|---|---|
| 3,780,424 | 12/1973 | Forestieri et al. | 136/251 X |
| 3,982,963 | 9/1976 | Mahoney et al. | 136/251 |
| 4,147,560 | 4/1979 | Gochermann | 136/251 |
| 4,233,085 | 11/1980 | Roderick et al. | 136/244 |
| 4,287,382 | 9/1981 | French | 136/251 |
| 4,322,261 | 3/1982 | Dubois | 136/251 X |
| 4,365,106 | 12/1982 | Pulvari | 136/206 |
| 4,443,651 | 4/1984 | Swartz | 136/244 |
| 4,554,038 | 11/1985 | Allard | 136/245 |
| 4,636,577 | 1/1987 | Peterpaul | 136/206 |
| 4,877,460 | 10/1989 | Flodl | 136/251 X |
| 4,898,347 | 2/1990 | Bianchi | 244/173 |
| 4,929,281 | 5/1990 | Worner | 136/206 |

FOREIGN PATENT DOCUMENTS

2484356  12/1981  France ..................................... 440/6

OTHER PUBLICATIONS

"Sovonics Solar Systems" 1987 Energy Conversion Devices, Inc.

Primary Examiner—David M. Mitchell
Assistant Examiner—Christopher P. Ellis
Attorney, Agent, or Firm—Fiddler Levine & Mandelbaum

[57] ABSTRACT

An apparatus for utilizing solar energy with solar cells, which are arranged on a supporting structure and are connected electrically to one another and have an external connection for discharging the electrical energy. Several solar cells are parts of a frameless solar cell element, in which the solar cells are enclosed next to one another between film strips or panels. At least one side of the laminate, which faces the sunlight, is flat and transparent. The solar cell laminate lies on a supporting structure, which comprises two covering layers and a supporting foam layer therebetween, the support being formed with a recessed circumferential edge. The laminate lies on the edge, flush with the upper side of the supporting structure. The support body is constructed in undulating fashion between two parallel sections of edge, in order to support the solar cell laminate on the higher sections and to provide, with the lower sections, ducts for conducting coolant as well as for accommodating electrical conductors.

11 Claims, 1 Drawing Sheet

APPARATUS FOR MOUNTING SOLAR CELLS

This application is a continuation of application Ser. No. 07/724,978, filed on Jun. 28, 1991, abandoned Mar. 8, 1993.

BACKGROUND OF THE INVENTION

The invention relates to an apparatus for utilizing the energy of the sun, and more particularly to an arrangement of solar cells on a supporting structure.

It is an object of the invention to provide a particularly appropriate refinement of the arrangement of solar cells on a supporting structure, which is to be highly permanent and extremely light and which preferably can be integrated into the upper deck of a water vessel. The arrangement of the solar cells to obtain energy should be accomplished in as simple a manner as possible, in order to keep the price of the arrangement within acceptable limits. The arrangement should be accomplished with few components, which have little tendency to break down. As a further main objective, the arrangement of solar cells should be of as low a weight as possible, so that the arrangement can be used universally beyond the particular application set forth herein.

SUMMARY OF THE INVENTION

In order to come as close as possible to accomplishing the objective of the invention, the invention provides for the use of frameless, encapsulated solar cells, so-called solar laminates, on a supporting structure preferably capable of accommodating a plurality of such solar laminates. Moreover, the invention involves the fixation of this plurality of solar laminates on the upper side of the supporting structure, such as by means of a translucent film, which is stretched smoothly over the solar laminates and fastened to the edges of the supporting structure.

BRIEF DESCRIPTION OF THE DRAWINGS

The invention is explained in greater detail by means of the drawings, in which.

DESCRIPTION OF THE PREFERRED EMBODIMENT

Figure 1:
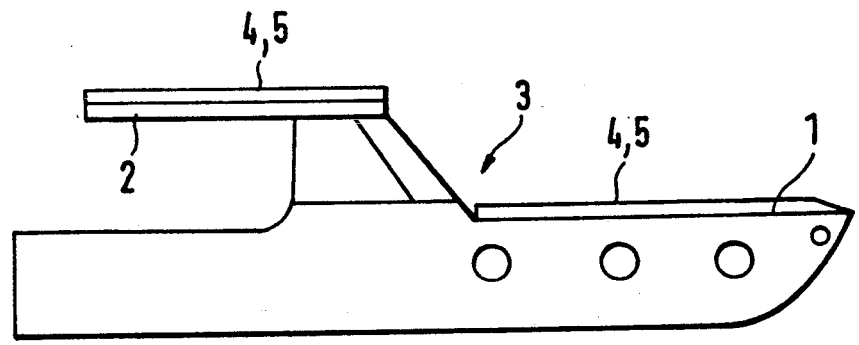
FIG. 1 is a side view of a ship, which is equipped according to the invention.
Figure 2:
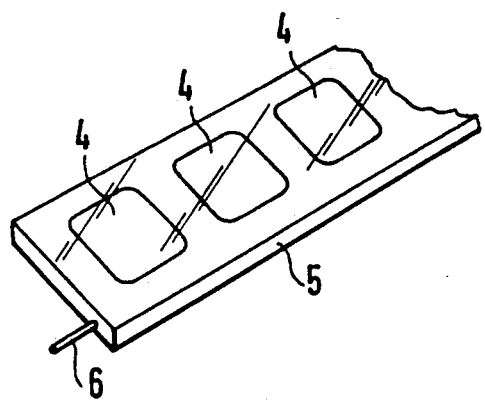
FIG. 2 is a perspective view of a solar laminate, as used according to the invention.
Figure 3:
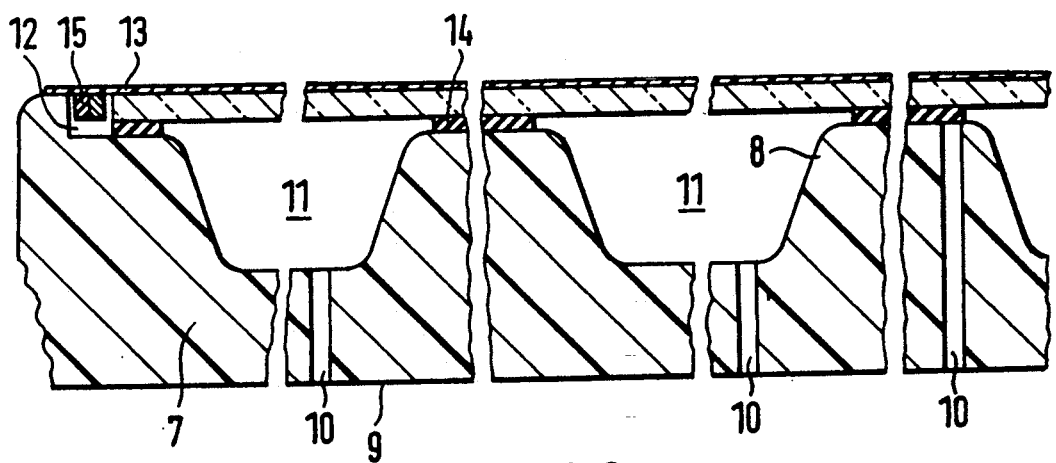
FIG. 3 is a cross-sectional view, through one of the two roof parts of the ship of FIG. 1, of an arrangement of solar cells which, according to the invention, are covered with solar laminates.

The upper sides of the foredeck 1 and of the roof 2 of an appropriately constructed ship or boat 3 are covered with encapsulated solar cells. These solar cells are constructed as solar laminates, that is, as solar modules without an encompassing frame. Several solar cells 4 are enclosed in a particular pattern, preferably in one row, but possibly in several rows, which cross one another or are disposed next to one another or behind one another in a translucent film strip 5, or in an appropriate thin panel, that is, they are enclosed by this film or panel. The film strip 5, or the panel, which encloses the solar cells 4, can consist of two superimposed individual strips or panels, which are connected with one another two-dimensionally and between which the solar cells 4 are held. The strip or plate, which in the installed state faces the radiation of the sun, is translucent, while the other strip or the other plate can be of the same material or optionally of a different, possibly opaque, material. The solar cells of such a "solar laminate" 4, 5 are connected electrically with one another and have a common current discharge 6. Usually, such a solar laminate is surrounded by a trimming ledge. However, frameless laminates, that is, laminates without a trimming ledge, are also used in conjunction with the invention. A plurality of such solar laminates are disposed in groups of rows and connected electrically with one another on the roof as well as on the foredeck.

The foredeck 1 and/or the roof 2 may be constructed as the supporting structure, which accommodates the enclosed solar cells. The roof or foredeck is of a so-called sandwich construction. The upper and lower covering panels, e.g., fiber mats, of this sandwich construction are spaced from one each other by a rigid foam and are reinforced with respect to each other by the rigid foam connected over the whole of its surfaces with the upper and lower covering panel.

According to the invention, the prepared rigid foam 7, which is appropriately contoured, preferably by cutting, is placed between the two mats 8, 9. The rigid foam has through holes 10, which extend between its two surfaces perpendicularly to the plane of the mats. A synthetic resin is applied in the flowable state on the external side of one mat and a vacuum is applied on the external side of the other mat, so that the synthetic resin is aspirated through the first-mentioned mat, the through holes 10 and the second-mentioned mat. As a result, on solidifying, the synthetic resin forms a composite from the two mats 8, 9 and the rigid foam 7 with extremely smooth solid surfaces. Sandwich constructions, so produced, are known and therefore need not be explained in greater detail. The upper covering panel of the sandwich construction is not flat, but has an undulating profile in order to provide both support and back ventilation of the solar cells. At the same time, the channels 11 (wave troughs) formed by the profiling serve to accommodate the electrical installation and cabling. Preferably, the wave troughs taper toward the inside.

Due to the profiling of the upper covering plate or mat, very high strength is achieved in the longitudinal direction, strength is attained in the transverse direction due to the joining of the upper and lower covering panels or mats 8, 9 with the interposed rigid foam 7. The construction of the supporting body for accommodating the encapsulated solar cells 4, 5 is self-supporting and requires no supporting construction.

The supporting body with the lower covering panel 9 and the profiled upper covering panel 8, as well as the interposed rigid foam are manufactured in one step, so that an economic continuous production is possible.

Each of the solar cell laminates rests at its perimeter on the recessed edge 12 of the supporting body. The recess corresponds to the thickness of the solar cell laminates, so that the solar cell laminates and the supporting body surrounding these lie in a horizontal plane, which, if necessary, is slightly arched.

The encapsulated solar cells are fixed in position with a film 13, which is passed smoothly, without bubbles and folds and appropriately stretched over the solar laminates and the edges of the supporting body and is glued on with a water-soluble adhesive. An appropriately dimensioned film, which may be assembled from individual sheets, can fix in position all of the solar cell laminates of the foredeck or roof with respect to the supporting body, or the solar cell laminates can be combined into several groups, the solar cell laminates of each group being fixed in position by a film. The number of solar cells combined in a laminate 4, 5 depends on the circumstances. Under some circumstances, a solar cell laminate may also enclose only one cell.

The film to be used is a conventional commercial film of high strength and high transparency, and is extremely resistant to UV light and scratch-resistant. Before it is applied, the film is coated on one side with a water-soluble adhesive. If the film is completely free of bubbles and mounted flat on the corresponding solar laminates by adhesion, there will be no losses due to reflections and the losses, as a whole, will be so small, that the efficiency of the solar cell laminates is adversely affected by the film to the least possible extent, if at all. Before the film is applied, the parts coming into contact with it are moistened, so that the adhesive becomes effective.

Overall, the invention is concerned with an arrangement which consists of a few, operationally reliable and inexpensive parts, which can be assembled with little effort, and which is operationally reliable over a long period. Should a solar cell laminate become defective, it can be repaired or exchanged. Occasionally, it is also possible to make such a repair or exchange by only partially removing the film. After that, the arrangement can be made again in an equally simple manner. The film is believed to be the optimum, but not the only means, for preventing the laminates from lifting upwards off the supporting structure.

In order to avoid distortions and to compensate for possible dimensional deviations, sponge rubber strips 14 and the like are placed between the solar laminates and the supporting structure. Moreover, these sponge rubber strips, especially those between the solar cell laminates and the edge of the supporting structure, prevent the penetration of moisture between the solar laminates and the supporting structure. For this purpose, the gaps are also filled with a permanently elastic sealing material 15, such as a silicone rubber.

The foamed supporting body 7 may be in one or several pieces.

We claim:

1. Apparatus for mounting solar panels comprising solar cell element means including a plurality of solar panel means in adjacent coplanar disposition, each solar panel means having a top solar energy receiving surface and a bottom surface, first lamination means covering said bottom surfaces of said solar panel means, and second lamination means overlaying said top surfaces of said solar panel means, said second lamination means being translucent, and support means having an upper generally planar surface with a recess having parallel flanges along its edges on which said solar cell element means is supported with said second lamination means substantially coplanar with said upper surface, said solar element means being firmly connected to said support means by said second lamination means, said support means comprising first and second mats with a rigid foam profile means inserted therebetween, said support means further having connecting ducts that run perpendicularly to the planes of said mats, said profile means being connected to said mats by a synthetic resin applied in the flowable state to the outside of said first mat and aspirated by a vacuum through said first mat, through the connecting ducts, and through said second mat to impart smooth surfaces to the mats and, hence, the support means.

2. The apparatus of claim 1, wherein said second lamination means is stretched smoothly over the solar cell element means mounted on the upper side of said support means.

3. The apparatus of claim 1 wherein said second lamination means is glued to said support means.

4. The apparatus of claim 3 wherein said glue comprises a water soluble adhesive.

5. The apparatus of claim 1 wherein said support means comprises a resilient member mounted on said planar surface.

6. The apparatus of claim 5 wherein said layer comprises sponge rubber.

7. The apparatus of claim 3 wherein there is a gap between said solar cell element means and said support means, said gap being sealed with a permanently elastic composition.

8. The apparatus of claim 3 wherein said recesses are essentially rectangular.

9. The apparatus of claim 8 wherein said recesses have corners that are rounded off and are tapered with distance from said solar cell element means.

10. The apparatus of claim 1 wherein the upper surfaces of said support means and said solar cell element means form a horizontal, generally flat, surface of a ship.

11. The apparatus of claim 10 wherein said ship surface is a deck surface.

* * * * *